United States Patent
Beck et al.

(10) Patent No.: US 9,019,043 B2
(45) Date of Patent: Apr. 28, 2015

(54) FEED THROUGH EMC FILTER

(71) Applicant: Schaffner EMV AG, Luterbach (CH)

(72) Inventors: Fabian Beck, Ruettenen (CH); Benedikt Othmar Scheller, Luterbach (CH)

(73) Assignee: Schaffner EMV AG (CH)

( * ) Notice: Subject to any disclaimer, the term of this patent is extended or adjusted under 35 U.S.C. 154(b) by 250 days.

(21) Appl. No.: 13/689,286

(22) Filed: Nov. 29, 2012

(65) Prior Publication Data

US 2013/0154766 A1  Jun. 20, 2013

(30) Foreign Application Priority Data

Dec. 20, 2011 (CH) ........................................ 2009/11

(51) Int. Cl.
  *H04B 15/00* (2006.01)
  *H03H 7/00* (2006.01)
  *H03H 1/00* (2006.01)

(52) U.S. Cl.
  CPC ................. *H04B 15/00* (2013.01); *H03H 7/00* (2013.01); *H03H 2001/0021* (2013.01); *H03H 1/0007* (2013.01)

(58) Field of Classification Search
  CPC ..... H03H 7/0115; H03H 1/0007; H01G 4/35; H01G 4/40
  USPC .................... 333/12, 181, 182, 185
  See application file for complete search history.

(56) References Cited

U.S. PATENT DOCUMENTS

| 4,451,803 | A |   | 5/1984 | Holdsworth et al. |
| 4,455,538 | A | * | 6/1984 | Kinzler .......................... 333/167 |
| 5,020,149 | A | * | 5/1991 | Hemmie ........................ 455/325 |
| 6,750,738 | B2 |  | 6/2004 | Lindenberger |
| 2003/0227355 | A1 |  | 12/2003 | Lindenberger |
| 2011/0230943 | A1 |  | 9/2011 | Johnson et al. |
| 2012/0175351 | A1 | * | 7/2012 | Hirota ......................... 219/78.16 |

FOREIGN PATENT DOCUMENTS

| DE | 3528574 A1 | 2/1987 |
| DE | 4025159 A1 | 2/1992 |
| DE | 4218171 A1 | 12/1993 |
| DE | 10240084 A1 | 3/2004 |
| EP | 1349270 A1 | 10/2003 |
| JP | 2207470 A | 8/1990 |

\* cited by examiner

*Primary Examiner* — Benny Lee
*Assistant Examiner* — Rakesh Patel
(74) *Attorney, Agent, or Firm* — Blank Rome LLP

(57) ABSTRACT

An EMC power filter comprising a filter circuit and a conductive housing enclosing the filter circuit, wherein said filter circuit comprises: at least one electric conductor consisting in a rigid busbar for carrying an electric power, at least one ferromagnetic element for modifying the impedance of the electric conductor, at least one capacitor electrically connected between the electric conductor and the conductive housing. The housing has a tubular shape with a square cross section, allowing a rotation of the filter of 90° within the housing.

11 Claims, 4 Drawing Sheets

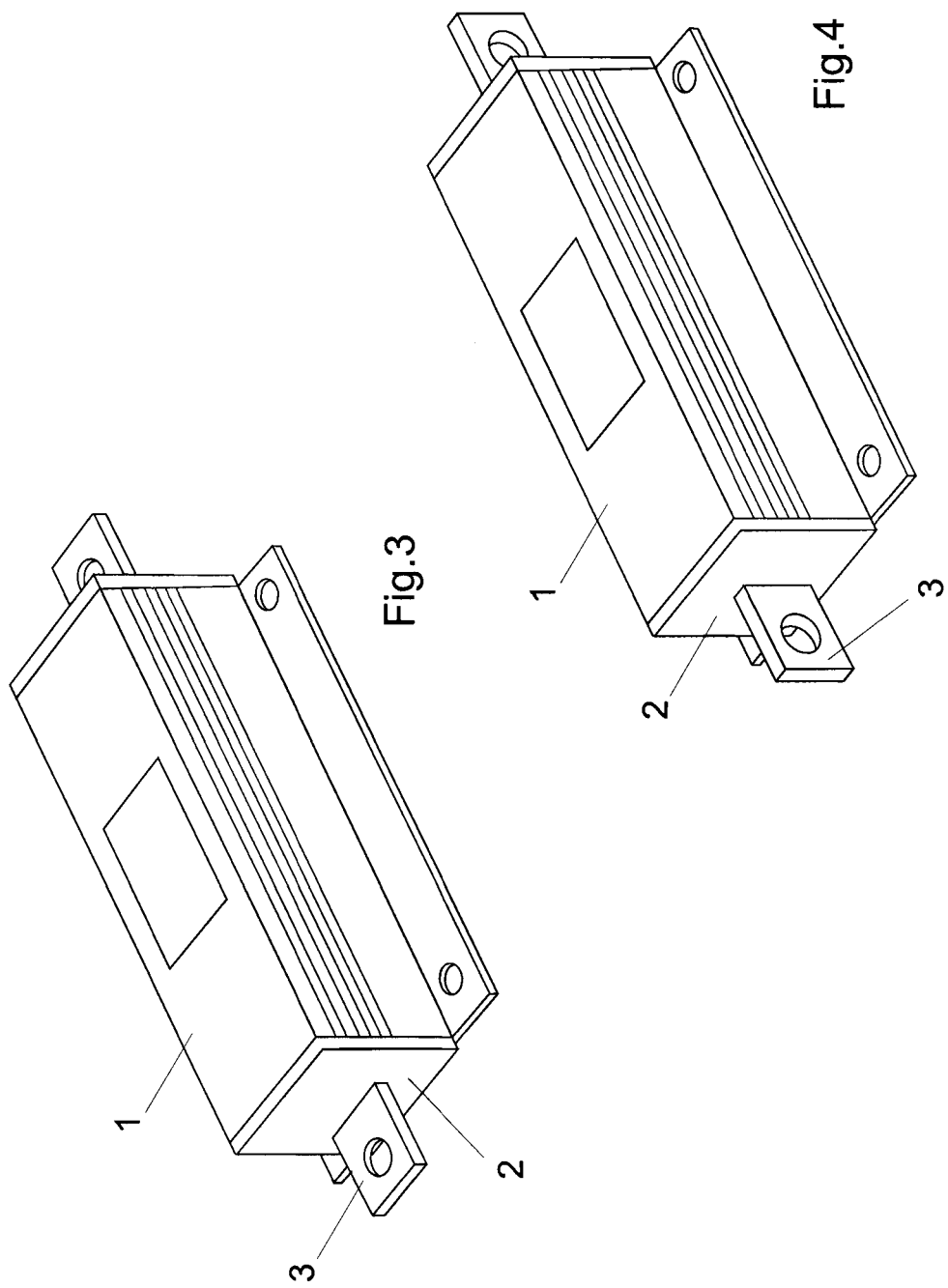

FEED THROUGH EMC FILTER

REFERENCE DATA

The present application claims priority from Swiss patent application CH02009/11 of Dec. 20, 2011, the contents whereof are hereby incorporated in their entirety.

FIELD OF THE INVENTION

Embodiments of the present invention relate to a feed-through EMC filter, in particular to a high-current EMC filter according to the independent claim.

DESCRIPTION OF RELATED ART

Feed-through components such as feed-through filters or feed-through capacitors are electrical components usually mounted in an electric power line. They consist are utilized in an electric circuit arranged around a conductor in a housing. The conductor extends into the housing creating two outer contacts for connecting external elements. The elements of the circuit consist of capacitors, ferromagnetic materials or resistances, which are in many embodiments co-axial with the electric conductor.

Feed-through components are used generally for changing the transmitting properties of electric power or data lines. Such filters including for example a π-filter circuit are mainly used for wide band noise reduction of power lines supplying current to sensitive or noise generating devices. A π-filter circuit consists mostly of two identical capacitive members and one ferromagnetic member. Such feed-through components are known from DE4218171, DE10240084 or DE4025159.

An example of housing according to the prior art is shown on FIG. 1. The housing of common feed-through filters is usually made of stamped metal plates; openings for the filter inputs and outputs are stamped. This results in a costly manufacturing process. Moreover, different stamping tools are required for producing filters with different lengths.

Those stamped housings typically cover only three faces of the filter, i.e., the two side faces and the top. The bottom face is either not protected by the metal housing, thus resulting in an inefficient EMC shielding, or closed by an additional metal plate fixed to the housing, adding costs to the device.

The busbar extends outside of the housing in an orientation (horizontal or vertical) determined by the orientation of the openings at each longitudinal extremities of the housing. Usually, electric cables are soldered perpendiculary to each extremity of the busbar. It would be desirable to orientate the busbar so that each cable can be soldered in the desired direction and leave the filter in the requested direction. In the prior art, this is usually achieved by making an elbow at the extremity of the busbar. This elbow makes the feed-though filter more bulky, and force the manufacturer to have two types of feed-though filter, with or without the elbow.

Moreover, there is a need in the prior art for a watertight and dust-tight housing, in order to protect more efficiently the sensitive components within the housing from water and dust projections.

SUMMARY OF THE INVENTION

It is one aim of the present invention to provide an EMC feed-though filter which is easier to assemble.

It is another aim of the invention to provide an EMC filter which is easier to mount in a variety of different configurations.

It is another aim of the present invention to create an EMC filter operable within a high frequency bandwidth.

According to the invention, these aims are achieved by means of the feature of the impended independent claim. Dependent claims give advantageous embodiments.

Especially these aims are solved by an EMC power filter unit comprising a filter circuit and a conductive housing enclosing the filter circuit, wherein said filter circuit comprises:

- at least one electric conductor consisting in a rigid busbar for carrying an electric power;
- at least one ferromagnetic element for modifying the impedance of the electric conductor;
- at least one capacitor electrically connected between the electric conductor and the conductive housing;
- said housing having a tubular shape with a square cross section, whereby the filter circuit can be received in the conductive housing in a first orientation and a second orientation rotated 90° from the first orientation.

The housing might have four sides defining the square-cross section. One of the four sides of the housing has fixation holes or other fixation means for mounting onto a printed circuit board for example. The holes or other fixation means can be provided on legs provided as extension of one of the sides. Therefore, if the busbar has a rectangular section, it can be mounted in an horizontal or vertical position by rotating the whole circuit before being received in the housing.

The housing might have four extruded sides defining the square cross section. The housing might be made of aluminium or any other extrudable conductive material.

The filter might comprise one plastic cap at each of the two extremities, for watertight closing of the extremities of the housing. The electric conductor might cross this cap. Therefore, watertightness does not rely on good application of a resin.

At least one contact spring might be provided for establishing an electrical contact between at least one of the capacitors and the housing. One capacitor might be provided between one electrode of each capacitor and the housing.

At least one of the capacitors, or each capacitor, has a first face and a second face in opposition, each face comprising an electric terminal, said faces being flat. The capacitor might be inserted and tightly held in position between the conductive housing and the electric conductor so as to create an electric contact between housing and conductor and the corresponding terminal of capacitor. The other electrode on the opposite face of the or each capacitor might be in direct physical contact with the electric conductor. Therefore, the or each capacitor is pressed by the electrically conductive contact spring between the busbar and the housing. At least one of the capacitors is connected solderless to the housing and/or to the electric conductor.

One advantage comes from the fact that flat connection elements are arranged on both sides of the capacitors, which allows an easy manufacturing process without soldering.

The invention can as well be used for 2-, 3- or 4-lines EMC filters comprising a plurality of parallel busbar in a housing with a square section.

A plastic, electrically isolating holder frame might be provided for holding the capacitors and the ferromagnetic element around the electric conductor. The holder frame might comprise two elongated parts mutually clipped to each other around the electric conductor and within the housing.

A potting compound might be provide for transmitting heat from the electric components to the housing. A sealing part assembly, preferably an assembly of synthetic material, might be provided for protecting the capacitors from the potting compound. The sealing part assembly might comprise two sealing elements. Each element of the sealing compound might be clipped to the holder frame or directly to the busbar. At least one of said sealing elements might comprise at least one window through which a contact spring establishes an electric contact between one of the capacitor and the housing.

BRIEF DESCRIPTION OF THE DRAWINGS

The invention will be better understood with the aid of the description of an embodiment given by way of example and illustrated by the figures, in which:

The invention will be better understood with the aid of the description of an embodiment given by way of example and illustrated by the figures, in which:

FIG. 3 and FIG. 4 show two perspective views over an EMC power filter, illustrating how the circuit can be rotated in the housing so that the busbar is either horizontal or vertical.

DETAILED DESCRIPTION OF THE INVENTION

Figure 1:
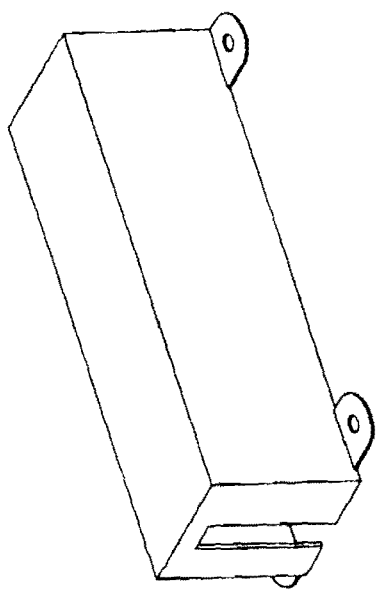
FIG. 1 shows a perspective view over a housing according to the prior art.
Figure 2:
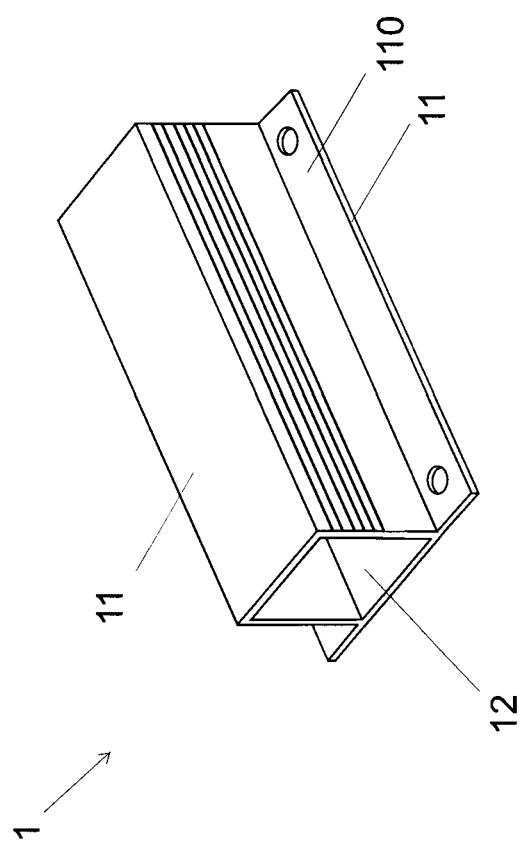
FIG. 2 shows a perspective view over a housing according to one embodiment of the invention.

FIG. 2 illustrates an example of housing 1 according to one embodiment of the invention. The housing comprises four sides 11 defining a cylindrical inner volume with a square cross-section. The lower side 11 is larger than the other three sides and therefore form two legs 110 extending horizontally on each sides of the housing. Those legs comprise fixation holes or other fixation means for fixing the housing to a printed circuit board or to any other external parts, for example with screws going through the holes.

The housing 1 is preferably made of extruded aluminium, for good thermal and electrical conduction and low fabrication cost at various extruded lengths. The external sides of the housing might be corrugated for good thermal exchange with the ambient air. The mounting legs 110 are integral with the housing and extruded during the same operation.

FIG. 3 illustrates a completely assembled EMC power filter according to one embodiment of the invention. Both extremities at each longitudinal end of the housing 1 are closed with an insulating cover 2 made of an electrically isolating, elastically compressible material, such as a polyurethane for example. The insulating covers close in a water-tight way both extremities of the housing. An electrical conductor 3, such as a busbar, crosses both covers through a rectangular slot, and traverses the housing from one longitudinal end to the other. The busbar 3 has a flat, rectangular section and is mounted horizontally on FIG. 3. Through holes at each end of the busbar are provided for soldering a cable to the busbar.

FIG. 4 illustrates the same EMC power filter but in which the busbar and the electrical components are rotated by + or −90°, so that the busbar is vertical. Although the electrical filtering function is the same, the orientation is more convenient if the connecting cables soldered to the busbar have to leave in an horizontal direction. Since all electrical components are mounted around the busbar, the whole assembly can be received in the conductive housing in a first orientation and a second orientation rotated 90° from the first orientation.

Figure 5:
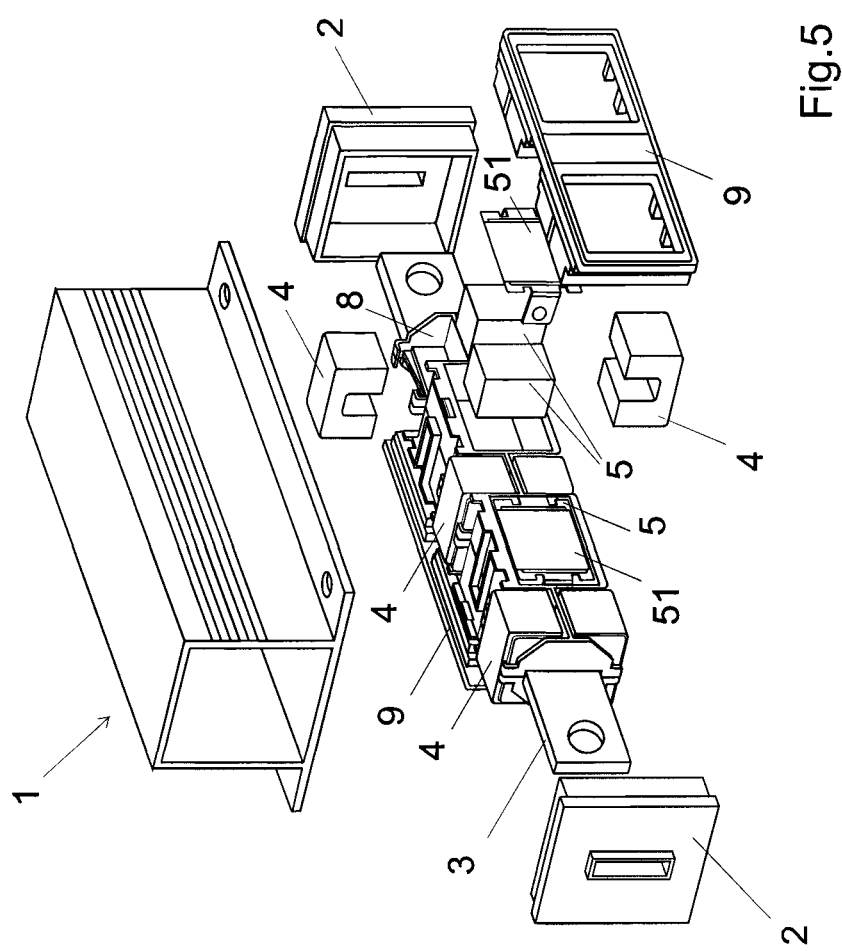
FIG. 5 shows an exploded view over the various components of the filter.

FIG. 5 is an exploded view illustrating how the main components of the EMC power filter are mounted within the housing 1 and around the busbar 3. An holding part, such as a plastic holder frame 8, is provided for holding all components, including the capacitors and the ferromagnetic elements around the busbar 3. The plastic holder frame 8 advantageously comprises two elongated parts mutually clipped to each other around the busbar and within the housing. The plastic holder frame is electrically non conductive, and may be produced by moulding or injection.

Capacitors 5 are held by the holder frame 8 so as to establish a capacitive path between the busbar 3 and the housing 1 which is connected to the ground. At least one of the capacitors 5, or preferably all capacitors, have a first face and a second face in opposition, each one of which comprises an electric terminal. Both faces are flat. One of the faces is in direct contact with the busbar, while the other face is electrically connected with a contact spring 51 that establishes an electrical contact with the housing 1, and pushes the capacitor against the busbar so as to hold it tightly in position. The connection between the capacitors and the busbar on one side, and the housing on the other side, is thus solderless. The lateral sides of each capacitor are held in recess of the holding frame. In the illustrated embodiment, the capacitors 5 have a square section.

At least one ferromagnetic element 4 is provided around the busbar for modifying the impedance of the electric conductor. In the example, the ferromagnetic element comprises a plurality of pairs, here 3 pairs, of C-shaped ferrite elements held by the holder frame 8 around the busbar 3. The two ferrite elements of each pair are mutually held against each other by the holder frame 8 so as to form a ferromagnetic ring around the busbar 3.

A potting compound (not shown) is injected around all the components, for maintaining them in a fixed position and for transmitting heat from the electric components to the housing. A sealing part assembly 9 of synthetic material is provided for protecting the capacitors and other components from the potting compound. The sealing part assembly comprises two sealing elements. At least one of said sealing elements has at least one window through which a contact spring 51 establishes an electric contact between one of the capacitor 5 and the conductive housing 1.

The invention claimed is:
1. An EMC power filter, comprising:
a filter circuit and
a conductive housing enclosing the filter circuit,
wherein said filter circuit comprises:
at least one electric conductor for carrying an electric power, wherein the at least one electric conductor is a rigid busbar;
at least one ferromagnetic element for modifying the impedance of the at least one electric conductor;
at least one capacitor electrically connected between the at least one electric conductor and the conductive housing;
wherein said conductive housing has a tubular shape with a square cross section, a whereby the filter circuit can be received in the conductive housing in a first orientation and a second orientation rotated 90° from the first orientation;
the EMC power filter further comprising a plastic holder frame for holding said at least one capacitor and said at least one ferromagnetic element around said at least one electric conductor.

2. The EMC power filter of claim 1, wherein said conductive housing has four extruded sides defining said square cross section.

3. The EMC power filter of claim 2, wherein said conductive housing is made of aluminium.

4. The EMC power filter of claim 1, comprising at least one insulating cover for watertight closing of one of a plurality of extremities of the conductive housing, said at least one electric conductor traversing said cover.

5. The EMC power filter of claim 1, comprising at least one contact spring for establishing an electrical contact between the at least one capacitor and said conductive housing.

6. The EMC power filter of claim 1, wherein the at least one capacitor has a first face and a second face in opposition, each one of which comprises an electric terminal, wherein said first and second faces are flat, and the at least one capacitor is inserted and tightly held in position between the conductive housing and the at least one electric conductor so as to create an electric contact between said conductive housing and said at least one electric conductor and the corresponding electric terminal of the at least one capacitor.

7. The EMC power filter of claim 6, wherein at least one of said electric terminals is in direct physical contact with the conductive housing.

8. The EMC power filter of claim 1, in which the at least one capacitor is connected solderless to the conductive housing and/or to the at least one electric conductor.

9. The EMC power filter of claim 1, comprising a plurality of electric components within the conductive housing; a potting compound for transmitting heat from the plurality of electric components to the conductive housing and a sealing part assembly of synthetic material for protecting said at least one capacitor from said potting compound.

10. The EMC power filter of claim 9, said sealing part assembly comprising two sealing elements, at least one of said two sealing elements comprising at least one window through which a contact spring establishes an electric contact between one of said at least one capacitor and said conductive housing.

11. The EMC power filter of claim 1, said plastic holder frame comprising two elongated parts mutually clipped to each other around said at least one electric conductor and within said conductive housing.

* * * * *